(12) United States Patent
Grunzke (10) Patent No.: US 9,257,182 B2
(45) Date of Patent: Feb. 9, 2016

(54) MEMORY DEVICES AND THEIR OPERATION HAVING TRIM REGISTERS ASSOCIATED WITH ACCESS OPERATION COMMANDS

(71) Applicant: MICRON TECHNOLOGY, INC., Boise, ID (US)

(72) Inventor: Terry Grunzke, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 391 days.

(21) Appl. No.: 13/723,781

(22) Filed: Dec. 21, 2012

(65) Prior Publication Data
US 2014/0181426 A1 Jun. 26, 2014

(51) Int. Cl.
| G06F 12/00 | (2006.01) |
| G11C 16/04 | (2006.01) |
| G06F 12/02 | (2006.01) |
| G11C 16/06 | (2006.01) |
| G11C 29/02 | (2006.01) |
| G11C 29/44 | (2006.01) |

(52) U.S. Cl.
CPC ........ *G11C 16/0483* (2013.01); *G06F 12/0246* (2013.01); *G11C 16/06* (2013.01); *G11C 29/028* (2013.01); *G06F 2212/7207* (2013.01); *G11C 2029/4402* (2013.01)

(58) Field of Classification Search
CPC . G06F 12/00; G06F 12/02; G06F 2212/1008; G06F 12/0246; G06F 2212/72; G06F 2212/7202; G06F 2212/7206; G06F 2212/7207; G11C 16/06; G11C 16/20; G11C 16/0483; G11C 29/028; G11C 2029/4402
See application file for complete search history.

(56) References Cited

U.S. PATENT DOCUMENTS

| 7,463,520 | B2 | 12/2008 | Aritome | |
| 7,961,517 | B2 | 6/2011 | Aritome | |
| 8,238,160 | B2 | 8/2012 | Kim et al. | |
| 8,243,519 | B2 | 8/2012 | Park et al. | |
| 2001/0003837 | A1* | 6/2001 | Norman et al. | 711/5 |
| 2004/0254756 | A1* | 12/2004 | Strittmatter | 702/117 |
| 2008/0049505 | A1* | 2/2008 | Kim et al. | 365/185.11 |
| 2008/0252505 | A1* | 10/2008 | Lee et al. | 341/146 |
| 2010/0214843 | A1* | 8/2010 | Kim et al. | 365/185.18 |
| 2010/0254193 | A1* | 10/2010 | Park et al. | 365/185.18 |
| 2012/0059976 | A1* | 3/2012 | Rosenband et al. | 711/103 |
| 2012/0110249 | A1* | 5/2012 | Jeong et al. | 711/103 |
| 2013/0007348 | A1* | 1/2013 | Fai et al. | 711/103 |
| 2013/0326096 | A1* | 12/2013 | Cohen et al. | 710/74 |

* cited by examiner

*Primary Examiner* — Michael Krofcheck
(74) *Attorney, Agent, or Firm* — Dicke, Billig & Czaja, PLLC (57) ABSTRACT

Methods, and apparatus configured to perform methods, including loading trim settings into a trim register of a memory device associated with a command for an access operation, receiving the command for the access operation at the memory device, setting trims for the access operation in response to the trim settings of the trim register associated with the command for the access operation, and performing the access operation using the trims for the access operation; and including performing an access operation on a memory device using trims corresponding to trim settings, receiving a command to suspend the access operation, loading updated trim settings into a particular trim register of the memory device, setting updated trims for the access operation in response to the updated trim settings of the particular trim register, and resuming the access operation using the updated trims.

33 Claims, 9 Drawing Sheets

MEMORY DEVICES AND THEIR OPERATION HAVING TRIM REGISTERS ASSOCIATED WITH ACCESS OPERATION COMMANDS

TECHNICAL FIELD

The present disclosure relates generally to memory devices and, in particular, in one or more embodiments, the present disclosure relates to methods for loading trim settings for memory access operations while performing other access operations and apparatus to facilitate such methods.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the memory cells, through programming (which is often referred to as writing) of data-storage structures, using charge-storage structures (e.g., floating gates or charge traps) or other physical phenomena (e.g., phase change or polarization), determine the data state of each cell. Common uses for flash memory include personal computers, personal digital assistants (PDAs), digital cameras, digital media players, cellular telephones, solid state drives and removable memory modules, and the uses are growing.

There is a continuing desire to improve accuracy of memory access operations, e.g., erase operations, read operations and write operations (sometimes referred to as program operations).

For the reasons stated above, and for other reasons stated below which will become apparent to those skilled in the art upon reading and understanding the present specification, there is a need in the art for alternative methods for facilitating improvements in accuracy of memory access operations.

DETAILED DESCRIPTION

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical, chemical and electrical changes may be made without departing from the scope of the present disclosure. The following detailed description is, therefore, not to be taken in a limiting sense.

Figure 1:
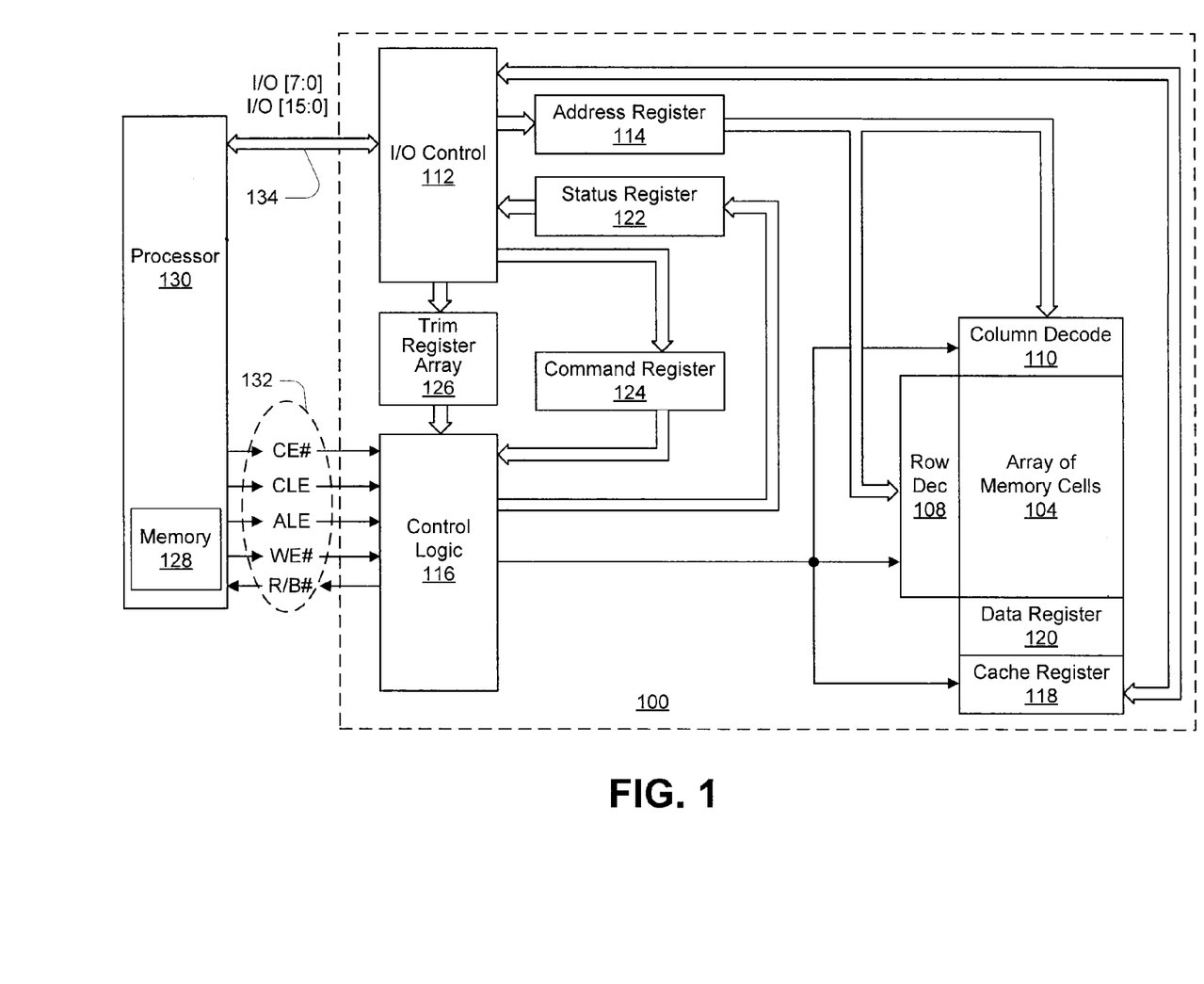
FIG. 1 is a simplified block diagram of a memory device in communication with a controller as part of an electronic system, according to an embodiment.

FIG. 1 is a simplified block diagram of a first apparatus in the form of a memory device 100 in communication with a second apparatus, in the form of an external controller (e.g., processor 130), as part of a third apparatus, in the form of an electronic system, according to an embodiment. Some examples of electronic systems include computer servers, network devices, personal computers, personal digital assistants (PDAs), digital cameras, digital media players, digital recorders, games, appliances, vehicles, wireless devices, cellular telephones and the like.

Memory device 100 includes an array of memory cells 104 logically arranged in rows and columns. Memory cells of a logical row are typically coupled to the same access line (commonly referred to as a word line) while memory cells of a logical column are typically selectively coupled to the same data line (commonly referred to as a bit line). A single access line may be associated with more than one logical row of memory cells and a single data line may be associated with more than one logical column.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

Control logic 116 controls access to the array of memory cells 104 in response to the commands and generates status information for the external processor 130. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a program operation, data is passed from the cache register 118 to data register 120 for transfer to the array of memory cells 104; then new data is latched in the cache register 118 from the I/O control circuitry 112. During a read operation, data is passed from the cache register 118 to the I/O control circuitry 112 for output to the processor 130; then new data is passed from the data register 120 to the cache register 118. A status register 122 is in communication with I/O control circuitry 112 and control logic 116 to latch the status information for output to the processor 130.

Status register 122 may include a ready/busy register. For example, a 1-bit register could be used to indicate whether the memory device 100 is busy (e.g., that the memory device 100 is performing an access operation) or ready (e.g., that the memory device 100 has completed, or is not performing, an access operation). Status register 122 may further include a cache ready/busy register. For example, a 1-bit register could be used to indicate whether the cache register 118 is ready to accept new data (e.g., that data has been passed to either the data register 120 for writing to the array of memory cells 104 or to the I/O control circuitry 112). Thus, reading the status register 122, such as by a controller, could be used to determine whether the memory device 100 is involved in an access operation or not, e.g., whether or not the memory device is ready to initiate an access operation, or whether the cache register 118 is ready to accept data input. The controller could be an external controller, such as processor 130 (which can be part of a memory controller or other external host device), or an internal controller, such as one including I/O control circuitry 112 and/or control logic 116. Alternatively, or in addition, an internal controller (e.g., control logic 116 of memory device 100) might provide a ready/busy (R/B#) signal to provide an indication to an external controller (e.g., processor 130) of whether or not the memory device 100 is involved in an access operation or otherwise busy. For example, memory devices often provide a pin (e.g., a pin of control link 132) that is asserted to a logic low, for example, when the device is involved in an access operation and is pulled up to a logic high when the device is again available (e.g., not involved in an access operation). The indication of the ready/busy signal may be dependent upon the access operation being performed by the memory device 100. For example, during a cache program operation (e.g., cache write operation), the ready/busy signal may indicate the status of the cache register 118 while, during other program operations, the ready/busy signal may indicate the status of the array of memory cells 104.

Control logic 116 is also in communication with a trim register array 126 in accordance with an embodiment. The trim register array 126 is configured to store trim settings that can be used to customize access operations of the array of memory cells 104, with trim settings often based on the locations of various groupings of memory cells of the array of memory cells 104 involved in the access operation. For example, when reading a memory cell of a selected access line of a block of memory cells, it is common to provide different voltages to unselected access lines of that block of memory cells based on their relative location to the selected access line. The voltages to be used for the unselected access lines and the selected access line are part of the trim settings associated with a read operation performed by the control logic 116, as is well understood. It is noted that a trim register of the trim register array 126 need not directly store a desired value of any particular trim setting, but may instead store a value indicative of the desired value. As an example, if a memory device were configured to provide one of four predefined voltages to one unselected access line during a read operation, two digits (e.g., bits) of a trim register of trim register array 126 could be used to indicate a particular voltage of the four predefined voltages, e.g., "00" could be indicative of a first of the four predefined voltages, "01" could be indicative of a second of the four predefined voltages, "10" could be indicative of a third of the four predefined voltages, and "11" could be indicative of a fourth of the four predefined voltages.

The operation of trim register array 126 can allow the trim register array 126 to be loaded from an external device, such as processor 130, and/or can associate a particular set of trim settings with a particular access operation command received from that external device. For example, if an excessive number of read errors are detected by the processor 130, different trim settings could be loaded into trim register array 126 for one or more subsequent read operations, whether on the same memory cells or not, in an attempt to reduce subsequent read errors. If the different trim settings are determined to improve read operations, such as showing a reduction of read errors, these trim settings could be saved as default settings for future read operations, for example. Similarly, if an excessive number of program errors are detected, or program times become excessive as is common when a memory device ages, different trim settings could be loaded into trim register array 126 for one or more subsequent program operations. If the different trim settings are determined to improve program operations, such as showing a reduction of program errors or time, these trim settings could be saved as default settings for future program operations, for example. Different trim settings might also be associated with different modes of operation (e.g., test modes) to be assumed by the memory device 100 associated with a particular access operation command as directed by the processor 130. Although example reasons were provided for altering trim settings, and examples of trim settings were provided, the various embodiments are not dependent upon a particular set of trim settings, or a particular reason for altering trim settings, for a particular access operation. Processor 130 may be in communication with a memory 128 (although FIG. 1 depicts the memory 128 as being internal to the processor 130, memory 128 could also be external to the processor 130; in either event, the processor 130 is "in communication with" the memory 128) storing trim settings for loading into the trim register array 126. For example, the memory 128 may store trim settings corresponding to different modes of operation, and the processor 130 might select trim settings for transmitting to the memory device 100 in response to a command from an external device (not shown in FIG. 1) indicative of a desired mode of operation.

Memory device 100 receives control signals at control logic 116 from processor 130 over a control link 132. The control signals may include at least a chip enable CE#, a command latch enable CLE, an address latch enable ALE, and a write enable WE#. Additional control signals (not shown) may be further received or provided over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming the array of memory cells 104. For another embodiment, cache register 118 may be omitted, and the data are written directly into data register 120. Data, e.g., from the array of memory cells 104 or the status register 122, are also output over input/output (I/O) pins [7:0] for an 8-bit device or input/output (I/O) pins [15:0] for a 16-bit device. I/O control circuitry 112 may include data buffers (not shown) to buffer commands, addresses and data received by the I/O control circuitry 112, e.g., from the I/O bus 134, cache register 118 or status register 122.

It will be appreciated by those skilled in the art that additional circuitry and signals can be provided, and that the electronic system of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O and command pins are described in accordance with popular conventions for receipt and output of the various signals, it is noted that other combinations or numbers of pins may be used in various embodiments.

Figure 2:
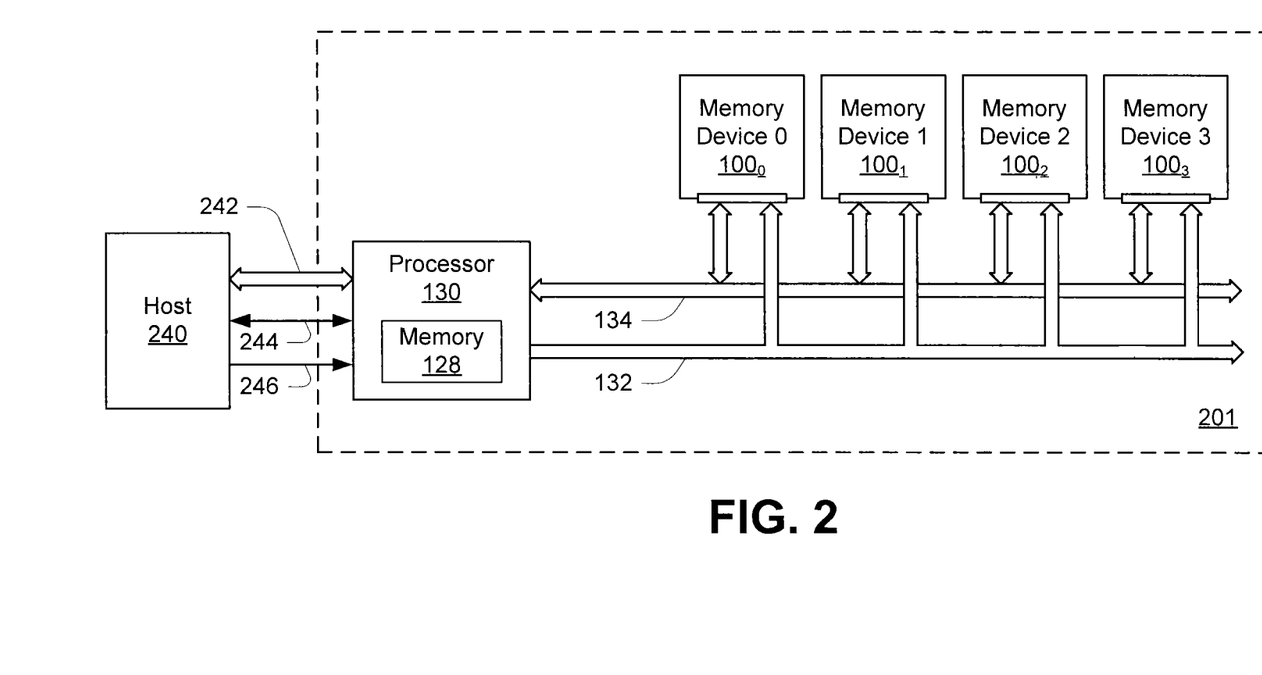
FIG. 2 is a simplified block diagram of a memory module in communication with a host as part of an electronic system, according to another embodiment.

A given processor 130 may be in communication with one or more memory devices 100. FIG. 2 is a simplified block diagram of an apparatus in the form of a memory module 201 in communication with a host 240 as part of an electronic system, according to another embodiment. Memory devices 100, processor 130 and memory 128 may be as described with reference to FIG. 1. Although memory module 201 is depicted with four memory devices 100, memory module could have one or more memory devices 100, and may include one or more other memory devices (not shown in FIG. 2) that are not configured to perform methods of various embodiments described herein. For some embodiments, processor 130 selects a particular set of trim settings from memory 128 to associate with a particular access operation command in response to commands received from the host 240. For some embodiments, processor 130 receives a particular set of trim settings from the host 240 to store in memory 128 and to associate with a particular access operation command in response to commands received from the host 240.

Because a controller (e.g., processor 130) is between the host 240 and the memory devices 100, communication between the host 240 and the processor 130 may involve different communication links than those used between the processor 130 and the memory devices 100. For example, the memory module 201 may be an Embedded MultiMediaCard (eMMC) of a solid state drive (SSD). In accordance with existing standards, communication with an eMMC may include a data link 242 for transfer of data (e.g., an 8-bit link), a command link 244 for transfer of commands and device initialization, and a clock link 246 providing a clock signal for synchronizing the transfers on the data link 242 and command link 244. The processor 130 may handle many activities autonomously, such as error correction, management of defective blocks, wear leveling and address translation.

Trim settings to be associated with an access operation command may relate to a variety of parameters (e.g., trims) used during the access operation, e.g., voltages to be applied (e.g., read voltage, pass voltage, programming voltage, inhibit voltage, source potential, well potential, etc.), voltage differentials to be used (e.g., voltage step changes in programming pulses during a program operation), quantities (e.g., maximum number of programming pulses to be applied before deeming an error), etc. In general, any parameter utilized by the memory device 100 during an access operation could be programmably set by a trim setting, and can thus be considered a "trim." Depending upon the access operation, or the desire of a user, changing trim settings for a particular access operation command may relate to trim settings associated with any grouping of memory cells of the array of memory cells 104, e.g., a logical row of memory cells, a physical row of memory cells, a block of memory cells, an array of memory cells, etc.

Figure 3A:
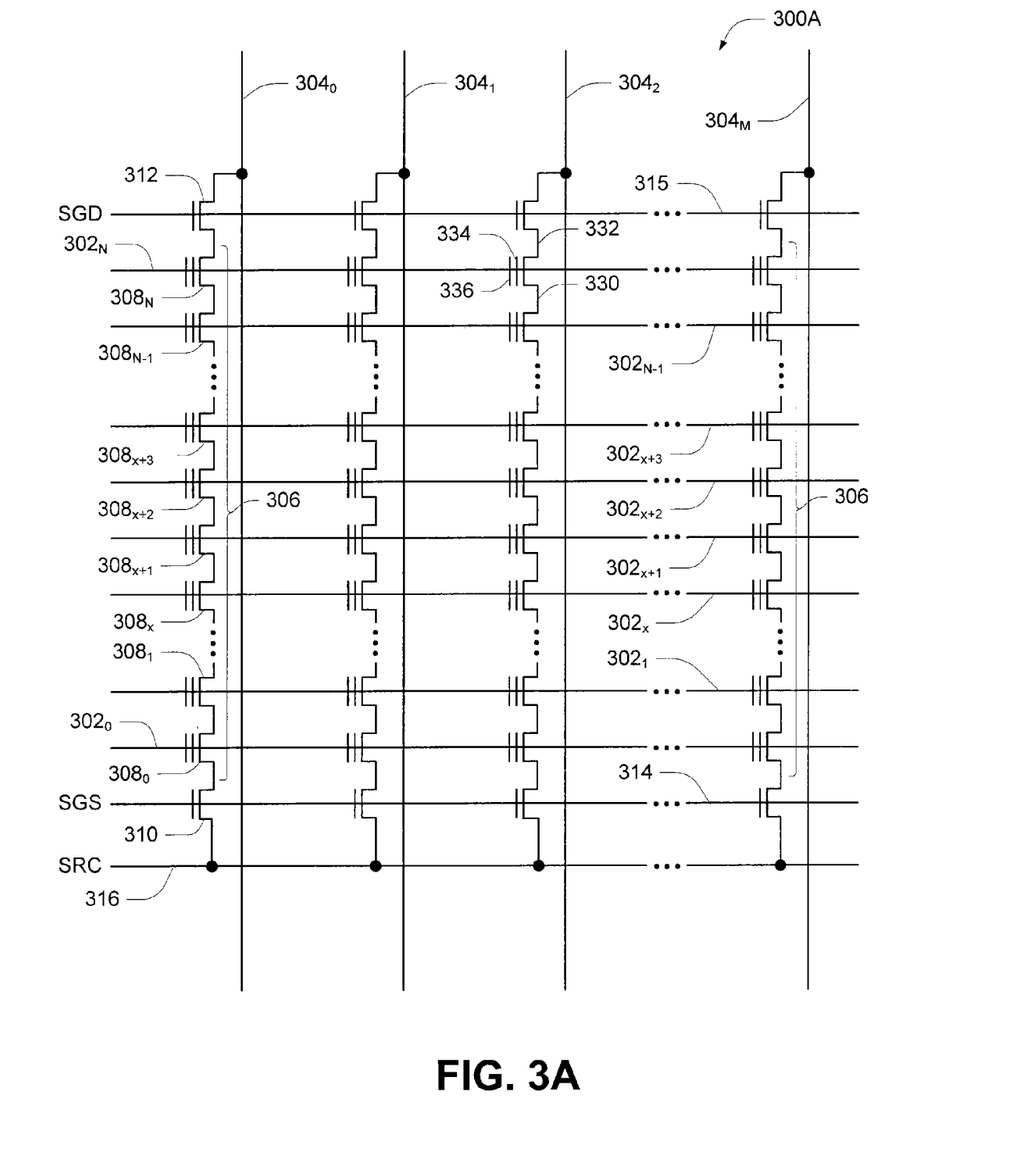
FIGS. 3A-3B are schematics of portions of an array of memory cells as could be used in a memory device of the type described with reference to FIG. 1.

FIG. 3A is a schematic of an array of memory cells 300A, e.g., as a portion of the array of memory cells 104, in accordance with an embodiment. Array of memory cells 300A includes access lines, such as word lines $302_0$ to $302_N$, and intersecting data lines, such as bit lines $304_0$ to $304_M$. For ease of addressing in the digital environment, the number of word lines 302 and the number of bit lines 304 are generally each some power of two, e.g., 256 word lines 302 by 4,096 bit lines 304.

Array of memory cells 300A is arranged in rows (each corresponding to a word line 302) and columns (each corresponding to a bit line 304). Each column may include a string of memory cells 308, such as one of the NAND strings 306. Each NAND string 306 may be coupled to a common source line (SRC) 316 and includes memory cells $308_0$ to $308_N$, each located at an intersection of a word line 302 and a bit line 304. The memory cells 308, depicted as floating-gate transistors in FIG. 3A, represent non-volatile memory cells for storage of data. The memory cells 308 of each NAND string 306 are connected in series, source to drain, between a source select line (SGS) 314 and a drain select line (SGD) 315.

Source select line 314 includes a source select gate 310, e.g., a field-effect transistor (FET), at each intersection between a NAND string 306 and source select line 314, and drain select line 315 includes a drain select gate 312, e.g., a field-effect transistor (FET), at each intersection between a NAND string 306 and drain select line 315. In this way, the memory cells 308 of each NAND string 306 are connected between a source select gate 310 and a drain select gate 312. Arrays of memory cells utilizing more than one select gate at one or both ends of a NAND string 306 are known. If multiple source select gates 310 are utilized for a given string of memory cells 306, they could be coupled in series between the common source line 316 and the memory cell $308_0$ of that string of memory cells 306. If multiple drain select gates 312 are utilized for a given string of memory cells 306, they could be coupled in series between the corresponding bit line 304 and the memory cell $308_N$ of that string of memory cells 306.

A source of each source select gate 310 is connected to common source line 316. The drain of each source select gate 310 is connected to the source of the memory cell 308 of a corresponding NAND string 306. Therefore, each source select gate 310 selectively couples its corresponding NAND string 306 to common source line 316. A control gate of each source select gate 310 is connected to source select line 314.

The drain of each drain select gate 312 is connected to the bit line 304 for the corresponding NAND string 306. The source of each drain select gate 312 is connected to the drain of the last memory cell $308_N$ of its corresponding NAND string 306. Therefore, each drain select gate 312 selectively couples a corresponding NAND string 306 to a corresponding bit line 304. A control gate of each drain select gate 312 is connected to drain select line 315.

Typical construction of memory cells 308 includes a source 330 and a drain 332, a data-storage structure 334 (e.g., a floating gate, charge trap, etc.) that can determines a data value of the cell (e.g., through changes in threshold voltage), and a control gate 336, as shown in FIG. 3A. Memory cells 308 have their control gates 336 coupled to (and in some cases form) a word line 302. A column of the memory cells 308 is a NAND string 306 or a plurality of NAND strings 306 coupled to a given bit line 304. A row of the memory cells 308 are memory cells 308 commonly coupled to a given word line 302. A row of memory cells 308 can, but need not include all memory cells 308 commonly coupled to a given word line 302. Rows of memory cells 308 often include every other memory cell 308 commonly coupled to a given word line 302. For example, memory cells 308 commonly coupled to word line $302_N$ and selectively coupled to even bit lines 304 (e.g., bit lines $304_0$, $304_2$, $304_4$, etc.) may be one row of memory cells 308 (e.g., even memory cells) while memory cells 308 commonly coupled to word line $302_N$ and selectively coupled to odd bit lines 304 (e.g., bit lines $304_1$, $304_3$, $304_5$, etc.) may be another row of memory cells 308 (e.g., odd memory cells). Although bit lines $304_3$-$304_5$ are not expressly depicted in FIG. 3A, it is apparent from the figure that the bit lines 304 of the array of memory cells 300A may be numbered consecutively from bit line $304_0$ to bit line $304_M$. Other groupings of memory cells 308 commonly coupled to a given word line 302 may also define a row of memory cells 308. For certain memory devices, all memory cells commonly coupled to a given word line might be deemed a physical row, while those portions of the physical row that are read during a single read operation or programmed during a program operation (e.g., even or odd memory cells) might be deemed a logical row, sometimes referred to as a page.

Figure 3B:
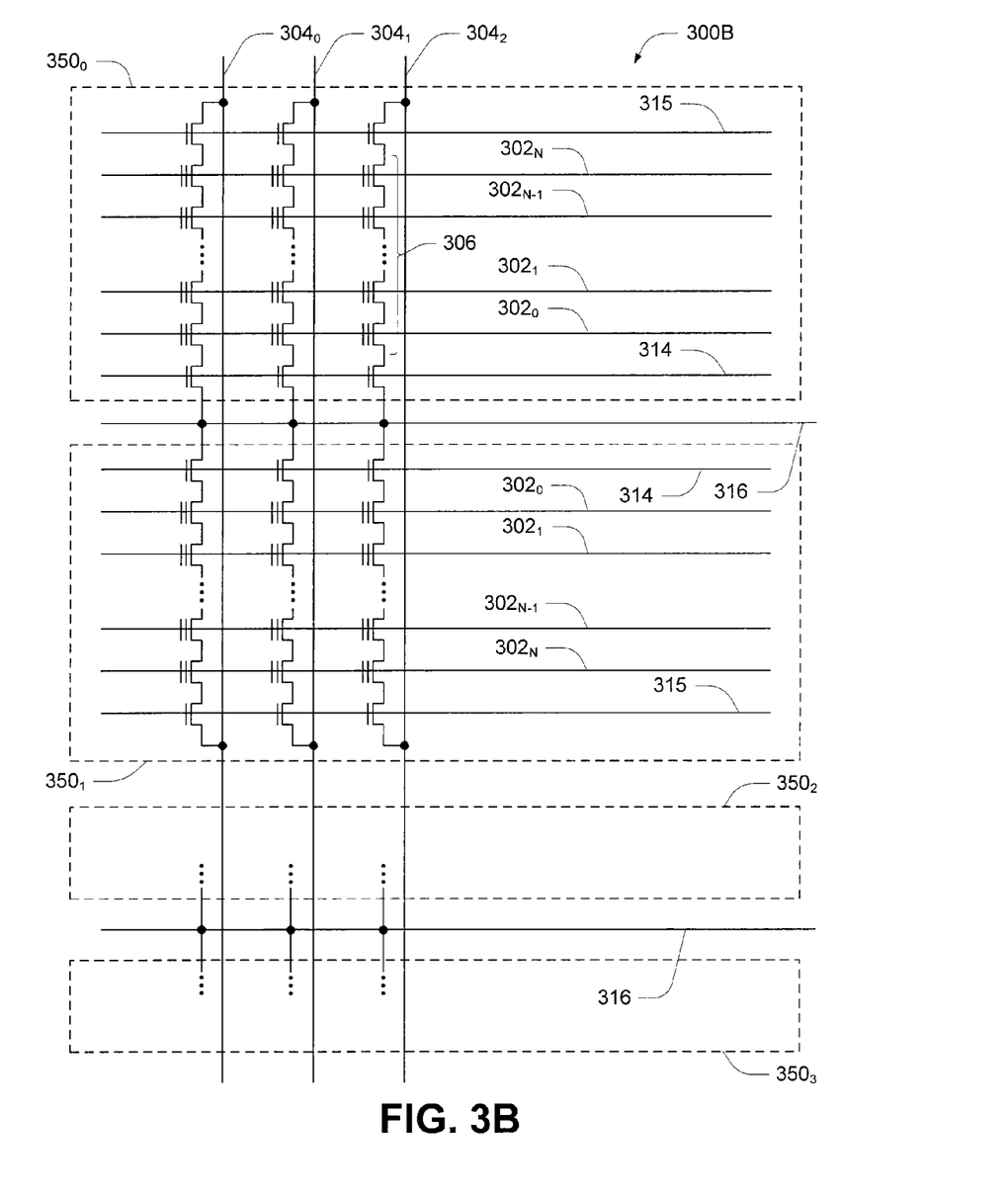

FIG. 3B is a schematic of an array of memory cells 300B, e.g., as a portion of the array of memory cells 104, in accordance with another embodiment. Array of memory cells 300B may include NAND strings 306, word lines 302, bit lines 304, source select lines 314, drain select lines 315 and source lines 316 as depicted in FIG. 3A. The array of memory cells 300A may be a portion of the array of memory cells 300B, for example. FIG. 3B depicts groupings of NAND strings 306 into blocks 350. Blocks 350 may be erase blocks, e.g., groupings of memory cells 308 that may be erased together in a single erase operation.

Although the examples of FIGS. 3A-3B were discussed in conjunction with NAND architecture memory, the embodiments described herein are not limited to NAND architecture memory. As such, the array of memory cells 104 can include other memory architectures, such as NOR architecture, AND architecture, etc.

Figure 4:
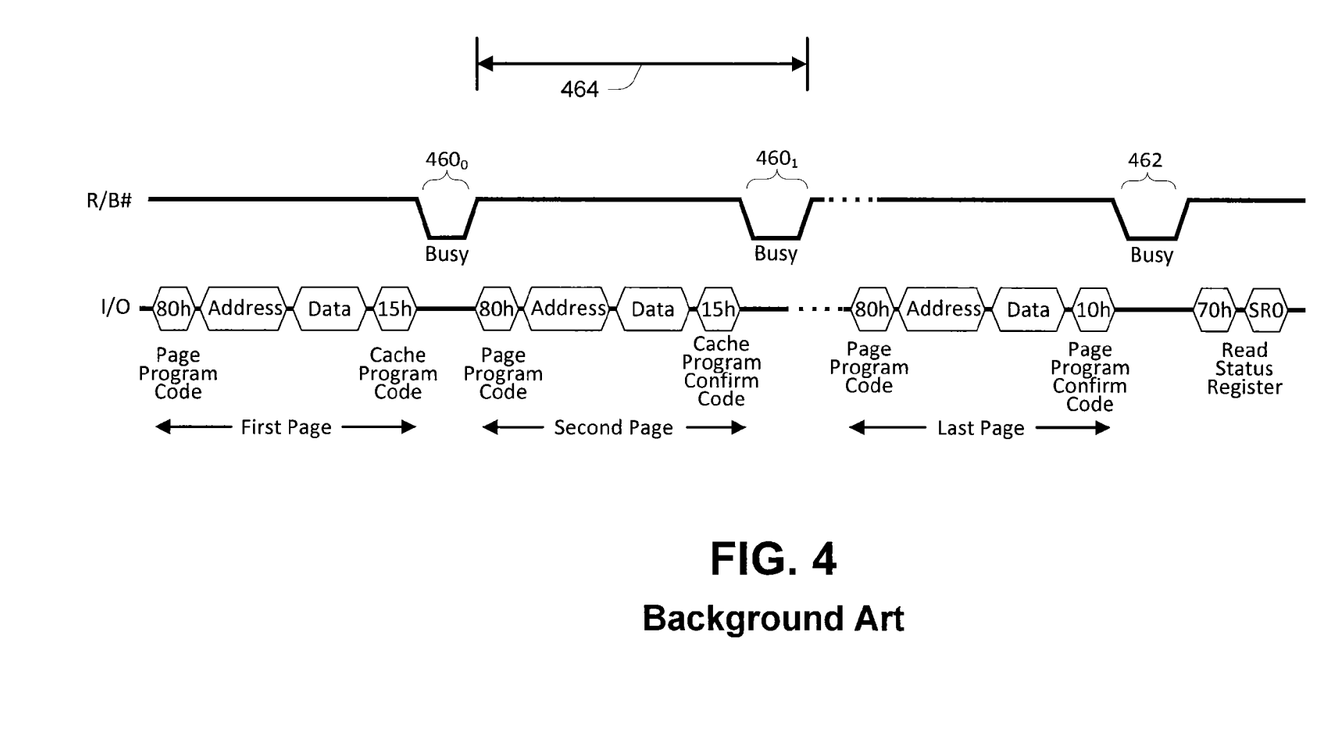
FIG. 4 is a timing diagram of a typical cache program operation for reference in describing various embodiments.

Various embodiments may find particular relevance with regard to cache program operations and cache read operations. Cache program and read operations can improve program and read throughput, respectively, for large files. During cache program operations, the device loads the data in a cache register while the previous data is transferred to the data register and programmed into the memory array. During cache read operations, the device loads the data in a cache register while the previous data is transferred to buffers of the I/O control circuitry to be read. While the device is busy, but able to accept data inputs, the trim register can be loaded with trim settings for a subsequent access operation while possibly not affecting the timing of a previous access operation, depending upon the length of time needed for the access operation, thus facilitating additional advantages. FIG. 4 is a timing diagram of a typical cache program operation for reference in describing various embodiments. It is noted that the timing diagram is not drawn to scale.

In a typical cache program operation, a program operation for a first page of data may be initiated by sending a page program code (e.g., 80 h). This page program code is followed by a location address and the data to be programmed. To indicate a desire to operate the program operation as part of a cache program operation, a cache program code (e.g., 15 h) is then sent. This cache program code indicates to the memory device that a subsequent program operation can be expected while the device is busy programming the data for the first page. The cache program code further indicates that a ready/busy signal (e.g., R/B#) should indicate whether the cache register is busy, rather than whether the array is busy, thus allowing the ready/busy signal to indicate whether a subsequent program operation may be queued while the prior program operation is being performed. Note that this ready/busy signal does not indicate when the array of memory cells is busy performing the prior program operation, as new data may be input without affecting the program operation during a cache program operation. When the ready/busy signal indicates that new data may be accepted, a program operation for a second page of data may be queued in like manner, and this sequence for subsequent pages of data may be repeated. For example, a cache program operation might accept a sequence of 64 program operations.

It is noted that while the second program operation may be queued after the time that it takes the data for the first program operation to be transferred out of the cache register to the data register for programming (e.g., time period $460_0$), queuing subsequent program operations may be delayed for some additional period of time as data cannot be transferred from the cache register to the data register until a prior programming operation is complete. For example, in a typical memory device, time period $460_1$ may be several hundred microseconds longer than time period $460_0$ as the second program operation does not have to wait for the prior program operation to complete before transferring data to the cache register. However, a next subsequent program operation (not shown in FIG. 4) may have to wait for the second program operation to complete before data for the next subsequent program operation could be loaded into the cache register. Despite this additional delay, cache program operations still provide efficiencies over standard program operations for a sequence of pages.

To signify the end of a cache program operation, i.e., that the cache program operation will have no further program operations in its sequence, a page program confirm code (e.g., 10 h) might be sent to the memory device. This can inform the memory device, for example, that the ready/busy signal should now indicate whether the array is busy, rather than just the cache register, thus providing an indication of when the last program operation of the cache program operation is complete. Time period 462 might represent the program time for the last two program operations minus the time required to receive the program code, address, data and program confirm code for the last program operation. Thus, in a typical memory device, time period 462 may be several hundred microseconds longer than time period $460_1$.

Various embodiments can take advantage of the extra delay of time period $460_1$ and similar periods following receipt of the cache program confirm code. In particular, with reference to FIG. 4, sending the page program code, address, data and cache program confirm code for the second, or subsequent, program operation of the cache program operation can be delayed without affecting the overall program time of the cache program operation. Because time period $460_1$ typically includes a portion of the program time for the prior program operation, various embodiments could insert a command to load the trim register with different trim settings associated with a subsequent access operation command Time period 464 represents a minimum of either the time to queue a program operation plus the time to transfer data from the cache register to the data register, or the time to perform the prior program operation plus the time to transfer data from the cache register to the data register. Commonly, however, the time to perform a prior program operation is several hundred microseconds longer that the time to queue a subsequent program operation, such that additional activities could be accommodated without affecting the overall program time of a cache program operation.

Figure 5:
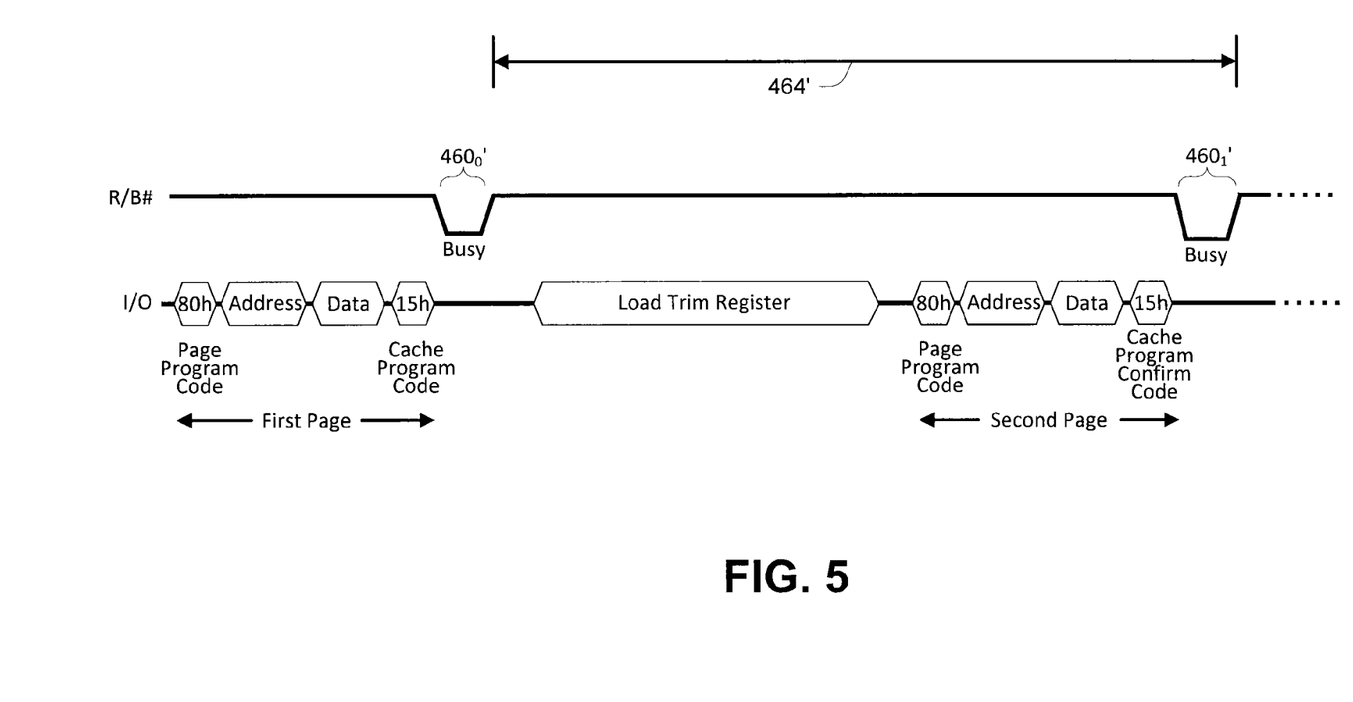
FIG. 5 is a timing diagram of a cache program operation in accordance with an embodiment.

FIG. 5 is a timing diagram of a cache program operation in accordance with an embodiment. The description of FIG. 5 with regard to queuing program operations is generally the same as with FIG. 4, except that a load trim register operation is queued between queuing the first program operation of the cache program operation and queuing the second program operation of the cache program operation. In practice, the load trim register operation could utilize a similar command format to the program operation. For one embodiment, a command code could be provided to the memory device indicating a desire to load a trim register. This code could then be followed by data for the trim settings associated with the trim register, which could then be followed by a confirm code to indicate that the command is complete. Such an example might apply to a load trim register operation intended to load trim settings associated with a subsequent (e.g., next) program operation. For another embodiment, a command code could be provided to the memory device indicating a desire to load a plurality of trim registers associated with a plurality of program operations. This code could then be followed by data for the trim settings associated with the plurality of trim registers, which could then be followed by a confirm code to indicate that the command is complete. Such an example might apply to a load trim register operation intended to load trim settings associated with more than one subsequent program operations, e.g., all program operations of the cache program operation. The command for the load trim register operation could be received by the memory device immediately preceding the command for the subsequent access operation, i.e., with no intervening commands regardless of any delays between the commands. It is noted that if it is desired to load trim settings associated with the first program operation of the cache program operation, a load trim register operation could be performed before queuing the first program operation as described with reference to the second program operation.

In FIG. 5, the time period $460_0'$ would be the same as time period $460_0$ in FIG. 4, assuming the same memory device and operation. Time period $460_1'$ of FIG. 5 would generally be less than time period $460_1$ of FIG. 4, by an amount approximately equal to a time to queue the load trim register operation. However, time period $464'$ of FIG. 5 would generally be equal to time period $464$ of FIG. 4 where the time to queue the load trim register operation plus the time to queue the subsequent program operation is less than or equal to the time to perform the prior program operation, such that the cache program operation would not be adversely affected by entry of the load trim register operation in this manner.

While the FIG. 5 was described with reference to a cache program operation, it will be understood that a load trim register operation in accordance with an embodiment could be performed before any access operation, e.g., a read operation, a write operation, or an erase operation, whether or not part of a cache operation sequence. Because different access operations might be associated with different sets of trim settings, and because different modes of operation or goals of a user might also lead to different sets of trim settings even within a particular access operation, a variety of load trim register operations might be desired. To accommodate loading different sets of trim settings, different load trim register operation might be defined to have different command codes and structures, where the command codes would indicate to the memory device what data to expect to receive and store to the trim register, and the structure would correspond to an order of the expected data.

Figure 6A:
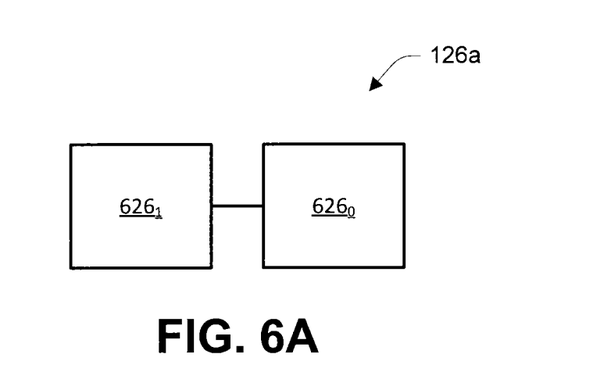
FIGS. 6A-6B are block diagrams of trim registers in accordance with various embodiments.
Figure 6B:
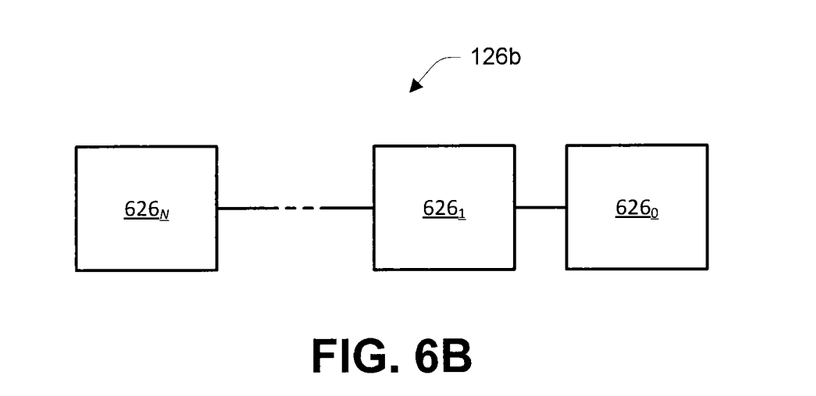

FIGS. 6A-6B are block diagrams of trim registers in accordance with various embodiments. FIG. 6A illustrates one example of a trim register array 126a. In this example, trim register array 126 includes a first trim register $626_0$ and a second trim register $626_1$. Each trim register 626 includes one or more storage locations for storing a set of trim settings. The trim register $626_0$ might store trim settings for one particular access operation while the trim register $626_1$ might store trim settings for another particular access operation. As one example, in response to a load trim register operation, trim settings for a particular access operation might be stored to trim register $626_0$. The memory device might then perform (e.g., initiate) the particular access operation (in response to receiving a command for the particular access operation, for example) using the trim settings from the trim register $626_0$. While the particular access operation is being performed, trim settings for a subsequent access operation might be stored to trim register $626_1$ in response to another load trim register operation. Upon completion of the particular access operation, the memory device might then perform the subsequent access operation (in response to receiving a command for the subsequent access operation, for example) using the trim settings from the trim register $626_1$. The trim register $626_0$ is then available to receive trim settings for a next subsequent access operation, and this toggling between the two registers 626 can be continued for further subsequent access operations. In this manner, each trim register 626, and its stored trim settings, is associated with a particular access operation. Alternatively, instead of toggling between the registers 626, upon completion of the original particular access operation, the trim settings of trim register $626_1$ could be transferred to trim register $626_0$ for use in the subsequent access operation, leaving the trim register $626_1$ available to receive trim settings for the next subsequent access operation. In like manner, each trim register 626, and its stored trim settings, is associated with a particular access operation in this example as well.

FIG. 6B illustrates another example of a trim register array 126b. The trim register array 126b can be thought of as an extension of the trim register array 126a to include additional registers 626. Operation of trim register array 126b can be similar to trim register array 126a in the sense that subsequent access operations can use trim settings from the registers 626, cycling from trim register $626_0$ to trim register $626_N$ in succession, and returning to trim register $626_0$ after using trim settings from trim register $626_N$. For trim register array 126b, a load trim register operation could load trim settings for a single access operation, with successive load trim register operations loading trim settings to individual registers 626 in succession. Alternatively, a load trim register operation for trim register array 126b could load trim settings for a number of sequential access operations, e.g., the program operations of a cache program operation. For example, if the cache program operation were to have N+1 program operations, the load trim register operation could load separate sets of trim settings to registers $626_0$ to $626_N$ as a single operation, if desired. Alternatively, the number of registers 626 of the trim register array 126b can be chosen for reasons unrelated to a number of possible sequential access operations. For example, N might be 2 or more, such that trim register $626_0$ might store trim settings for a current access operation, trim register $626_1$ might store trim settings for a subsequent access operation and trim register $626_2$ might be permitted to accept trim settings for a next subsequent access operation before the current access operation is completed. Similar to trim register array 126a, each trim register 626, and its stored trim settings, is associated with a particular access operation.

Figure 7:
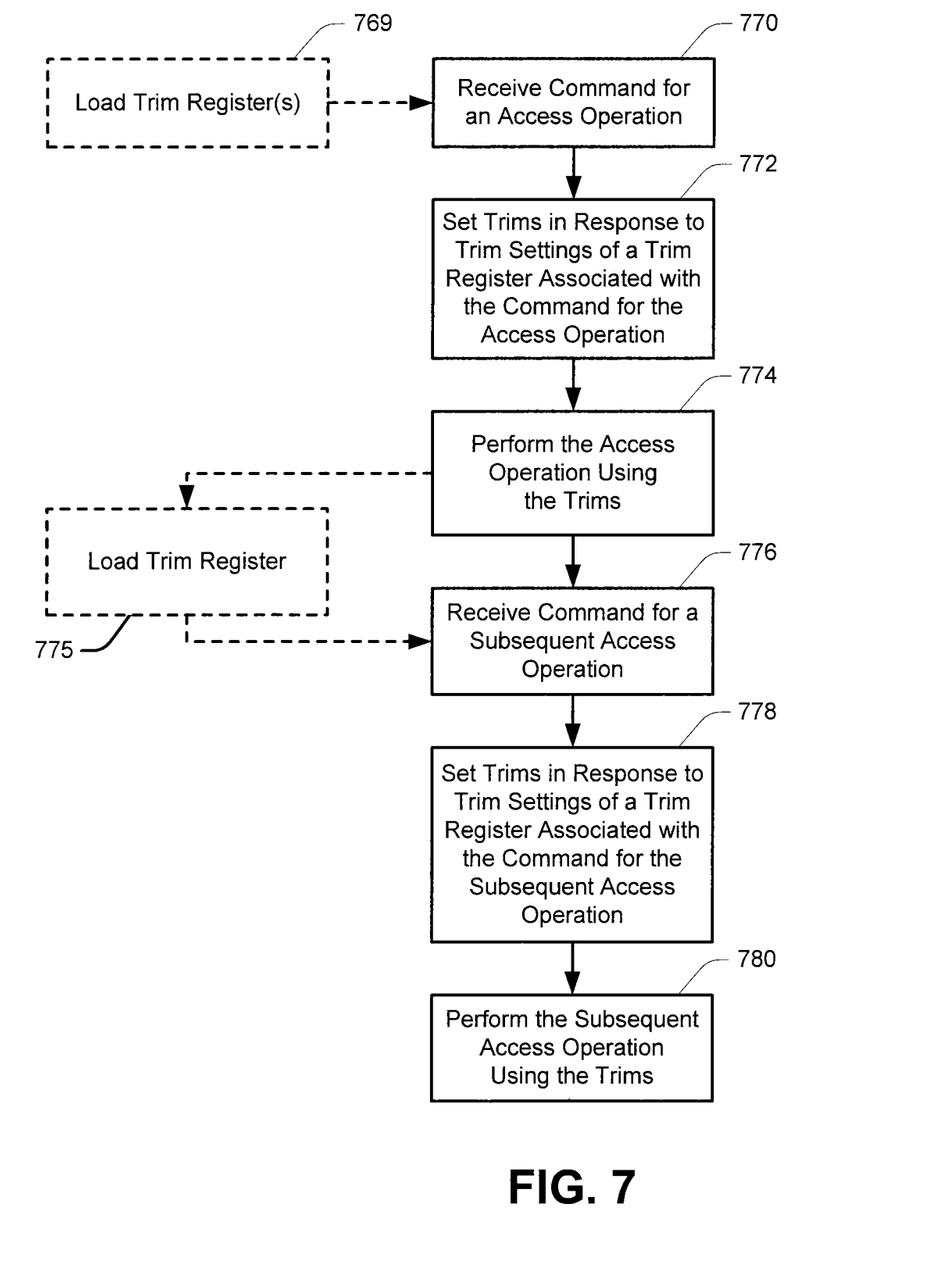
FIG. 7 is a flowchart of a method of operating a memory device in accordance with an embodiment.

FIG. 7 is a flowchart of a method of operating a memory device in accordance with an embodiment. At 770, a command for an access operation is received by the memory device. The command, e.g., an access code (program code, read code or erase code) and its corresponding confirm code, might be received from an external device, such as an external controller in communication with the memory device. In response to the command for the access operation, the memory device, at 772, sets trims for the access operation in response to trim settings of a trim register associated with the command for the access operation. For example, the trims for the access operation could be set in response to trim settings stored in a particular trim register associated with the access operation command, e.g., trim register $626_0$. The memory device then performs the access operation at 774, using the trims corresponding to the trim register associated with the access operation command.

At 776, a command for a subsequent access operation is received by the memory device. The command for the subsequent access operation might be received while performing the prior access operation, such as in a cache access operation. The subsequent access operation can be the same type of access operation as the prior access operation (e.g., both access operations might be program operations) or a different type of access operation than the prior access operation (e.g., the prior access operation might be a read operation and the subsequent access operation might be an erase operation). In response to the command for the subsequent access operation, the memory device, at 778, sets trims for the subsequent access operation in response to trim settings of a trim register associated with the command for the subsequent access operation. For example, the trims for the subsequent access operation could be set in response to trim settings stored in a particular trim register associated with the subsequent access operation command, e.g., trim register $626_1$. The memory device then performs the subsequent access operation at 780, using the trims corresponding to the trim register associated with the subsequent access operation command.

As noted with respect to FIG. 5, the trim registers could be loaded prior to performing the access operation. For example, a load trim register operation could be performed prior to receiving a command for an access operation. The load trim register operation could be performed in response to a command received from an external device, and the trim registers could be loaded with trim settings in response to data received from the external device in conjunction with the command. If the access operation corresponding to the command received at 770 requires a trim register to be loaded, this trim register could be loaded at 769. For another embodiment, multiple trim registers could be loaded at 769. For example, a load trim register operation command having a structure to include data for trim settings corresponding to multiple access operation commands (e.g., the command for the access operation of 770 and the command for the subsequent access operation of 776) could be used as described with reference to FIG. 5. Alternatively, a load trim register operation could be performed before each of the commands for access operations, e.g., at 769 and 775, to load trim settings to trim registers individually. The method can be continued for additional access operation by repeating the sequence 776-780 (e.g., where multiple trim registers were previously loaded, such as at 769) or repeating the sequence of 775-780 (e.g., where trim registers are loaded individually prior to each of the access operations).

Some memory devices may be configured to allow the suspension of an access operation, e.g., to perform some other operation on the memory device before resuming the access operation. Such memory devices typically store trim settings corresponding to the access operation that is active at the time of receiving a command to suspend, such as storing the trim settings to a trim register. When the device is ready to resume the access operation, either in response to a command to resume or in response to completion of the operation initiated after receiving the suspend command, trims can then be re-set in response to the stored trim settings. Various embodiments may benefit from permitting the memory device to change trims for an access operation while the access operation is suspended.

Figure 8:
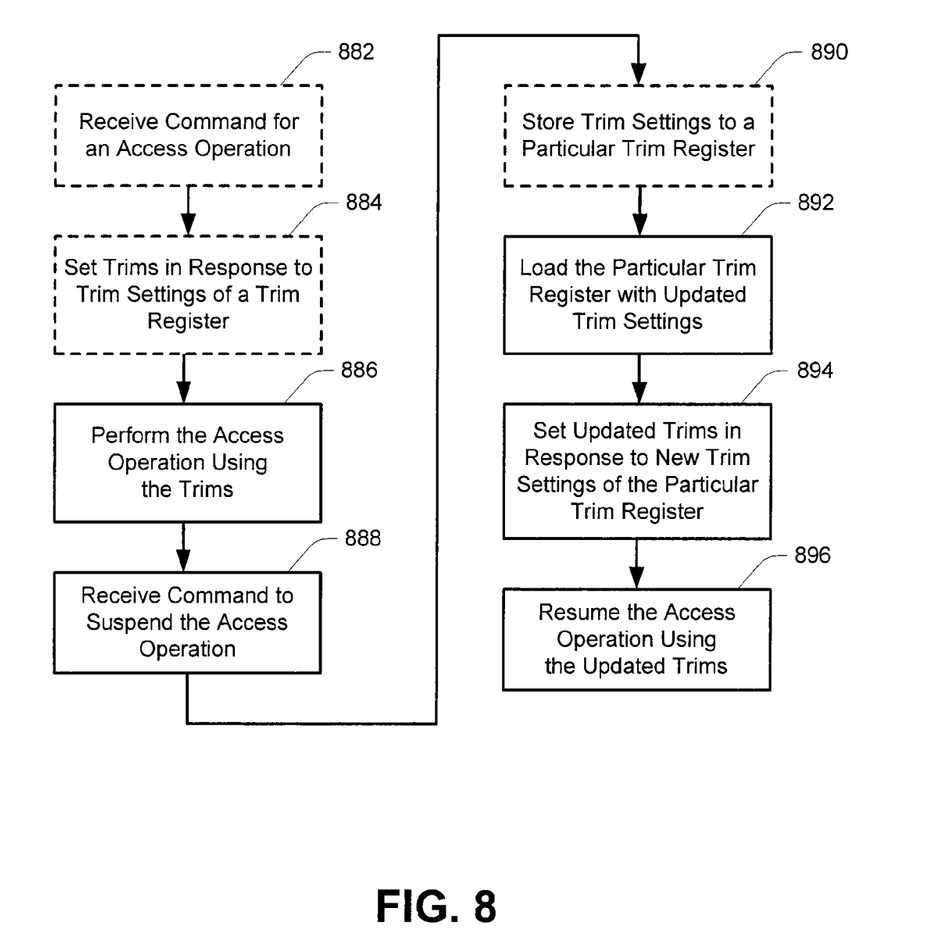
FIG. 8 is a flowchart of a method of operating a memory device in accordance with another embodiment.

FIG. 8 is a flowchart of a method of operating a memory device in accordance with another embodiment. At 882, a command for an access operation might be received by the memory device. The command, e.g., an access code (program code, read code or erase code) and its corresponding confirm code, might be received from an external device, such as an external controller in communication with the memory device. In response to the command for the access operation, the memory device, at 884, may set trims for the access operation in response to trim settings of a trim register. The trim register may be associated with the command for the access operation as discussed with reference to FIG. 7. The memory device then performs the access operation at 886, using the trims.

At 888, a command to suspend the access operation is received. The memory device may then perform another operation, e.g., in response to some other operation command. For example, the access operation might be an erase operation of a particular block of the array of memory cells. That erase operation could be suspended to allow a read operation to be performed on some other block of the array of memory cells before resuming the erase operation on the particular block. Alternatively, the suspend command may be sent merely to allow new trim settings to be loaded without performing some intervening operation. In response to the suspend command, the trim settings (e.g., trim settings corresponding to the trims used for the access operation) may be stored to a particular trim register at 890. Alternatively, a unique suspend command may be provided at 888 that indicates to the memory device that the access operation is to be suspended without a need to store the trim settings used for the access operation prior to receiving the suspend command. For example, if there is a desire to change trim settings after the access operation is initiated, but no intervening operation is desired, the access operation could be suspended without storing trim settings at 890.

At 892, the particular trim register is loaded with updated trim settings. For example, a load trim register operation could be performed in response to a load trim register operation command as previously described. For embodiments where trim settings are not stored at 890, a load trim register operation command and a suspend command may be a single command, i.e., indicative of a desire to both suspend an active access operation and to load updated trim settings to be used when the access operation resumes. At 894, updated trims are set in response to the updated trim settings of the particular trim register. Setting the updated trims may be in response to a command to resume the suspended access operation or in response to the completion of an intervening operation, for example. At 896, the access operation is resumed using the updated trims. The updated trim settings might include one or more trim settings different than the trim settings used prior to receiving the suspend command.

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method, comprising:
loading trim settings into a trim register of a memory device associated with a command for an access operation on an array of memory cells of the memory device;
receiving the command for the access operation at the memory device;
setting trims for the access operation in response to the trim settings of the trim register associated with the command for the access operation; and
performing the access operation using the trims for the access operations;
wherein loading the trim settings into the trim register occurs while performing a prior access operation on the array of memory cells.

2. The method of claim 1 further comprising:
loading trim settings into a trim register of the memory device associated with a command for a subsequent access operation on the array of memory cells;
receiving the command for the subsequent access operation at the memory device;
setting trims for the subsequent access operation in response to the trim settings of the trim register associated with the command for the subsequent access operation; and
performing the subsequent access operation using the trims for the subsequent access operation.

3. The method of claim 2, wherein loading trim settings into the trim register associated with the command for the access operation comprises loading the trim settings into the trim register associated with the command for the access operation in response to another command received by the memory device.

4. The method of claim 2, wherein loading trim settings into the trim register associated with the command for the subsequent access operation comprises loading the trim settings into the trim register associated with the command for the subsequent access operation in response to another command received by the memory device immediately preceding receiving the command for the subsequent access operation.

5. The method of claim 4, further comprising receiving the another command while performing the access operation.

6. The method of claim 5, further comprising receiving the command for the subsequent access operation at the memory device while performing the access operation.

7. The method of claim 2, wherein loading trim settings into the trim register associated with the command for the access operation and loading trim settings into the trim register associated with the command for the subsequent access operation are performed in response to a single command received by the memory device.

8. The method of claim 1, wherein loading the trim settings into the trim register occurs prior to receiving the command for the access operation.

9. The method of claim 1, wherein loading trim settings into a trim register of a memory device associated with a command for an access operation on an array of memory cells of the memory device comprises loading trim settings into a first trim register of the memory device in response to a command for a first access operation on the array of memory cells, and loading trim settings into a second trim register of the memory device in response to a command for a subsequent access operation on the array of memory cells.

10. The method of claim 9, further comprising toggling between the first trim register and the second trim register for loading trim settings in response to one or more next subsequent access commands.

11. The method of claim 9, further comprising loading trim settings into a third trim register of the memory device in response to a command for a next subsequent access operation on the array of memory cells.

12. The method of claim 1, wherein loading trim settings into a trim register of a memory device associated with a command for an access operation on the array of memory cells of the memory device comprises loading trim settings into an array of N trim registers of the memory device in response to receiving N commands for access operations on the array of memory cells, wherein N is an integer value, wherein each of the N trim registers are associated with a corresponding one of the N commands for access operations on the array of memory cells cycling from a first trim register of the array of N trim registers for a first command of the N commands for access operation on the array of memory cells to an Nth register of the array of N trim registers for an Nth command of the N commands for access operations on the array of memory cells.

13. The method of claim 12, further comprising loading trim settings into the first trim register of the array of N trim registers in response to receiving a subsequent (N+1)th command for an access operation on the array of memory cells.

14. A method, comprising:
loading trim settings into a trim register of a memory device associated with a command for an access operation;
receiving the command for the access operation at the memory device;
setting trims for the access operation in response to the trim settings of the trim register associated with the command for the access operation; and
performing the access operation using the trims for the access operation;
wherein loading the trim settings into the trim register occurs after an indication that a cache register of the memory device is able to accept data input.

15. A method, comprising:
loading trim settings into a first trim register of a memory device in response to a command for a first access operation on the array of memory cells;
receiving the command for the first access operation at the memory device;
setting trims for the first access operation in response to the trim settings of the first trim register;
performing the first access operation using the trims for the first access operation;
loading trim settings into a second trim register of the memory device in response to a command for a subsequent access operation; and
further comprising transferring the trim settings from the second trim register to the first trim register prior to performing the subsequent access operation.

16. A method, comprising:
    loading trim settings into a trim register of a memory device associated with a command for an access operation;
    receiving the command for the access operation at the memory device;
    setting trims for the access operation in response to the trim settings of the trim register associated with the command for the access operation; and
    performing the access operation using the trims for the access operation;
    wherein loading trim settings into the trim register associated with the command for the access operation and loading trim settings into the trim register associated with the command for the subsequent access operation are performed in response to a single command received by the memory device; and
    wherein the single command received by the memory device comprises a command code and a confirm code, and further comprising receiving data at the memory device between receiving the command code and receiving the confirm code corresponding to the trim settings for both trim registers.

17. The method of claim 16, further comprising receiving data at the memory device between receiving the command code and receiving the confirm code corresponding to the trim settings for at least one additional trim register.

18. A method, comprising:
    loading trim settings into a trim register of a memory device associated with a command for an access operation;
    receiving the command for the access operation at the memory device;
    setting trims for the access operation in response to the trim settings of the trim register associated with the command for the access operation; and
    performing the access operation using the trims for the access operation;
    wherein loading trim settings into the trim register associated with the command for the access operation comprises loading the trim settings into the trim register associated with the command for the access operation in response to another command received by the memory device; and
    wherein the another command received by the memory device comprises a command code and a confirm code, and further comprising receiving data at the memory device between receiving the command code and receiving the confirm code corresponding to the trim settings for the trim register associated with the command for the access operation.

19. A method, comprising:
    loading trim settings into a trim register of a memory device associated with a command for an access operation;
    receiving the command for the access operation at the memory device;
    setting trims for the access operation in response to the trim settings of the trim register associated with the command for the access operation;
    performing the access operation using the trims for the access operation;
    loading trim settings into a trim register of the memory device associated with a command for a subsequent access operation while performing the access operation;
    receiving the command for the subsequent access operation at the memory device;
    setting trims for the subsequent access operation in response to the trim settings of the trim register associated with the command for the subsequent access operation; and
    performing the subsequent access operation using the trims for the subsequent access operation.

20. The method of claim 19, wherein performing the access operation comprises an operation type selected from the group consisting of a read operation, a program operation and an erase operation.

21. The method of claim 20, wherein performing the subsequent access operation comprises an operation type selected from the group consisting of a read operation, a program operation and an erase operation.

22. The method of claim 21, wherein performing the access operation and performing the subsequent access operation comprises performing the same type of operation.

23. The method of claim 19, wherein setting trims for the subsequent access operation comprises setting the trims for the subsequent access operation after completion of the access operation.

24. The method of claim 19, further comprising receiving the command for the subsequent access operation at the memory device while performing the access operation.

25. The method of claim 19, wherein loading trim settings into the trim register associated with the command for the access operation and loading trim settings into the trim register associated with the command for the subsequent access operation are performed in response to a single command received by the memory device.

26. A method, comprising:
    loading trim settings into a trim register of a memory device associated with a command for an access operation;
    receiving the command for the access operation at the memory device;
    setting trims for the access operation in response to the trim settings of the trim register associated with the command for the access operation;
    performing the access operation using the trims for the access operation;
    loading trim settings into a trim register of the memory device associated with a command for a subsequent access operation while performing the access operation;
    receiving the command for the subsequent access operation at the memory device;
    setting trims for the subsequent access operation in response to the trim settings of the trim register associated with the command for the subsequent access operation; and
    performing the subsequent access operation using the trims for the subsequent access operation;
    wherein loading trim settings into the trim register associated with the command for the access operation and loading trim settings into the trim register associated with the command for the subsequent access operation are performed in response to a single command received by the memory device; and
    wherein the single command received by the memory device comprises a command code and a confirm code, and further comprising receiving data at the memory device between receiving the command code and receiving the confirm code corresponding to the trim settings for both trim registers.

27. The method of claim 26, further comprising receiving data at the memory device between receiving the command code and receiving the confirm code corresponding to trim settings for at least one additional trim register.

28. An apparatus, comprising:
- an array of memory cells;
- a controller; and
- a trim register array comprising a plurality of trim registers;
- wherein the controller is configured to load trim settings to a trim register of the trim register array in response to a command received by the memory device;
- wherein the controller is further configured to load the trim settings into the trim register while performing an access operation on the array of memory cells;
- wherein the controller is further configured to set trims in response to the trim settings of the trim register in response to receiving an access command associated with the trim settings of the trim register; and
- wherein the controller is further configured to perform an access operation on the array of memory cells using the trims in response to receiving the access command.

29. The apparatus of claim 28, wherein the controller is configured to load the trim settings to the trim register of the trim register array while performing a prior access operation on the array of memory cells.

30. The apparatus of claim 28, wherein the controller is further configured to associate the trim settings of the trim register with the access command.

31. The apparatus of claim 30, wherein the controller is further configured to associate the trim settings of the trim register with the access command by loading trim settings to trim registers of the trim register array in sequence.

32. The apparatus of claim 28, wherein the controller is further configured to select the trim settings in response to a command received from a host to the apparatus.

33. The apparatus of claim 28, wherein the controller is further configured to receive the trim settings from a host to the apparatus.

* * * * *

UNITED STATES PATENT AND TRADEMARK OFFICE
CERTIFICATE OF CORRECTION

PATENT NO. : 9,257,182 B2
APPLICATION NO. : 13/723781
DATED : February 9, 2016
INVENTOR(S) : Grunzke Page 1 of 1

It is certified that error appears in the above-identified patent and that said Letters Patent is hereby corrected as shown below:

In the Claims

Column 13, line 23, delete "operations" and insert in place thereof --operation--.

Column 14, line 65, delete "further comprising transferring" and insert in place thereof --transferring--.

Signed and Sealed this
Twenty-sixth Day of July, 2016

Michelle K. Lee
*Director of the United States Patent and Trademark Office*